US011444239B1

(12) United States Patent
Guo et al.

(10) Patent No.: US 11,444,239 B1
(45) Date of Patent: Sep. 13, 2022

(54) MAGNETORESISTIVE ELEMENT HAVING AN ADJACENT-BIAS LAYER AND A TOGGLE WRITING SCHEME

(71) Applicants: Yimin Guo, San Jose, CA (US); Rongfu Xiao, Dublin, CA (US); Jun Chen, Fremont, CA (US)

(72) Inventors: Yimin Guo, San Jose, CA (US); Rongfu Xiao, Dublin, CA (US); Jun Chen, Fremont, CA (US)

( * ) Notice: Subject to any disclaimer, the term of this patent is extended or adjusted under 35 U.S.C. 154(b) by 0 days.

(21) Appl. No.: 17/187,864

(22) Filed: Feb. 28, 2021

(51) Int. Cl.
*G11C 11/00* (2006.01)
*H01L 43/02* (2006.01)
*H01L 27/22* (2006.01)
*G11C 11/16* (2006.01)
*H01L 43/10* (2006.01)

(52) U.S. Cl.
CPC .......... *H01L 43/02* (2013.01); *G11C 11/161* (2013.01); *G11C 11/1673* (2013.01); *G11C 11/1675* (2013.01); *H01L 27/222* (2013.01); *H01L 43/10* (2013.01)

(58) Field of Classification Search
CPC ....... H01L 43/02; H01L 27/222; H01L 43/10; G11C 11/161; G11C 11/1673; G11C 11/1675
USPC ................................................. 365/158, 173
See application file for complete search history.

(56) References Cited

U.S. PATENT DOCUMENTS

| 8,508,006 | B2* | 8/2013 | Jan | G11C 11/161 |
| | | | | 257/E27.008 |
| 9,252,710 | B2* | 2/2016 | Wang | G01R 33/098 |
| 2009/0257151 | A1* | 10/2009 | Zhang | G11C 11/161 |
| | | | | 427/127 |

(Continued)

FOREIGN PATENT DOCUMENTS

CN 103563000 A * 2/2014 .......... G11C 11/161

*Primary Examiner* — Viet Q Nguyen

(57) ABSTRACT

A magnetoresistive element using combined spin-transfer-torque controlled magnetic bias and VCMA effects comprising a free layer and an adjacent-bias layer separated by a nonmagnetic spacing layer, wherein the free layer has an interfacial perpendicular magnetic anisotropy and a variable magnetization direction substantially perpendicular to a film surface, the adjacent-bias layer has a perpendicular magnetic anisotropy and a variable magnetization direction substantially perpendicular to a film surface, and the perpendicular anisotropy of the free layer is sufficiently higher than that of the adjacent-bias layer such that the critical switching current to reverse the free layer magnetization direction is at least 3 times as high as the critical switching current to reverse the adjacent-bias layer magnetization direction. Further, there is provided a toggle writing method of the perpendicular magnetoresistive element comprises: applying a first write pulse having a first voltage magnitude and a first pulse width to reverse the adjacent-bias layer magnetization direction to be anti-parallel to the free layer magnetization direction by spin-transfer-torque effect, and applying a second write pulse having a second voltage magnitude and a second pulse width to reverse the free layer magnetization direction to be parallel to the adjacent-bias (Continued)

layer magnetization direction by voltage-controlled magnetic anisotropy effect under the magnetic dipole bias field from the adjacent-bias layer.

20 Claims, 12 Drawing Sheets

(56) References Cited

U.S. PATENT DOCUMENTS

2010/0330395 A1* 12/2010 Zhang .................. G11B 5/3909
427/372.2

* cited by examiner

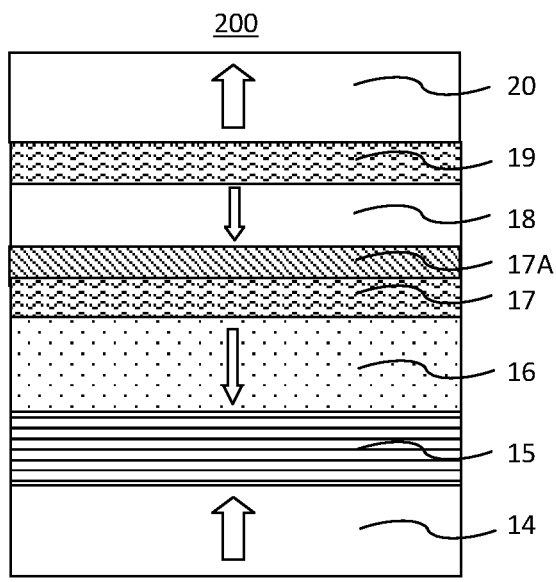
FIG. 6D
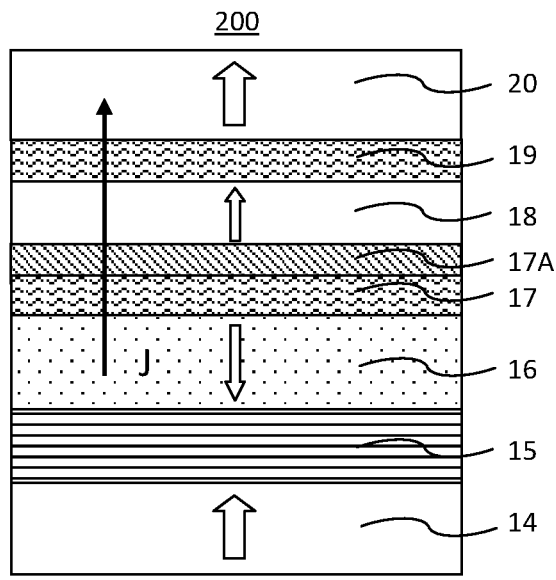 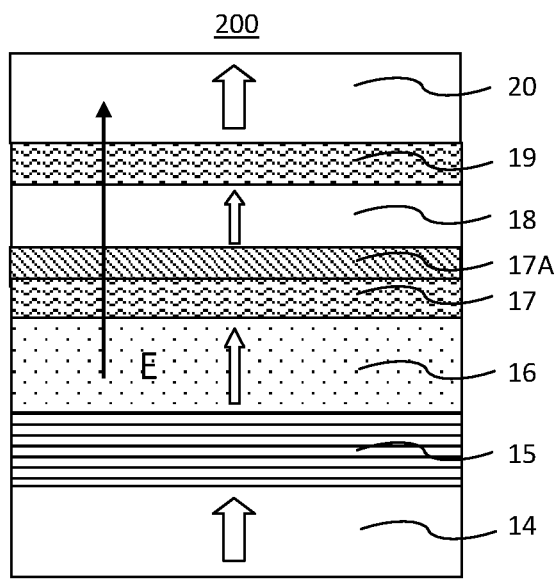
FIG. 6E                               FIG. 6F

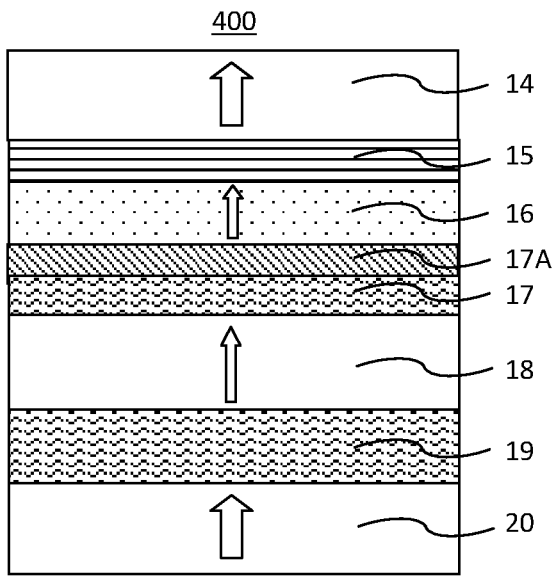
FIG. 11A
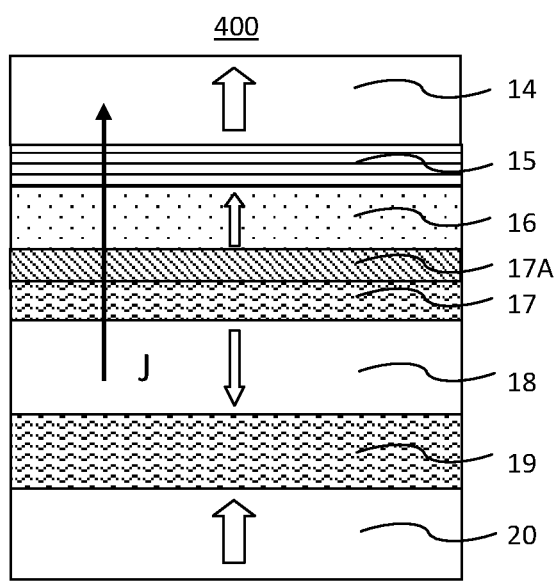 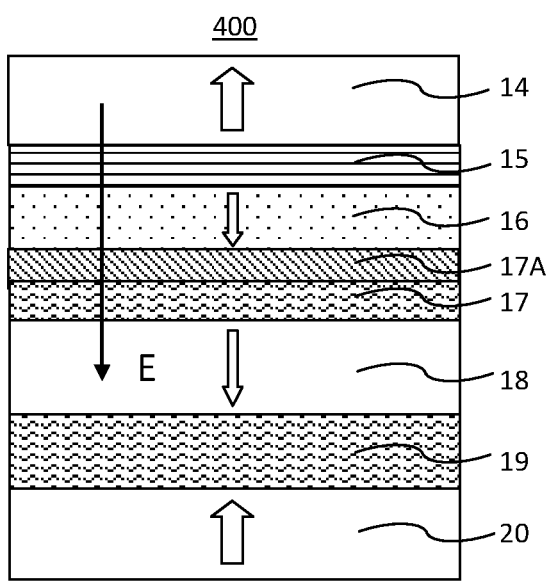
FIG. 11B            FIG. 11C

MAGNETORESISTIVE ELEMENT HAVING AN ADJACENT-BIAS LAYER AND A TOGGLE WRITING SCHEME

BACKGROUND OF THE INVENTION

1. Field of the Invention

This invention relates to the field of magnetoresistive elements. More specifically, the invention comprises magnetic-random-access memory (MRAM) using magnetoresistive elements having novel recording structures and a toggle writing method using spin-transfer-torque controlled bias and voltage-controlled magnetic anisotropy effect for low writing powers and high thermal stabilities as basic memory cells which potentially replace the conventional semiconductor memory used in electronic chips, especially mobile chips for power saving and non-volatility as well as memory blocks in processor-in-memory (PIM).

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer (also called a tunnel barrier layer), and a fixed reference layer that is located on the opposite side from the recording layer and maintains a predetermined magnetization direction. The change of electrical resistance of the MTJ device is attributed to the difference in the tunneling probability of the spin polarized electrons through the tunnel barrier on the bias voltage across the device in accordance with the relative orientation of magnetizations of the ferromagnetic recording layer and the ferromagnetic reference layer. The ferromagnetic recording layer is also referred to as a free layer. MR ratio is defined as $(R_{AP}-R_P)/R_P$, where $R_{AP}$ and $R_P$ are electrical resistances in anti-parallel (AP) and parallel (P) magnetization at zero-magnetic field, respectively.

Further, as in a so-called perpendicular MTJ element, both two magnetization films of the recording layer and the reference layer have easy axes of magnetization in a direction perpendicular to the film plane due to their strong perpendicular magnetic anisotropies (PMA) induced by interfacial interaction and/or crystalline structure (shape anisotropies are not used), and accordingly, the device size can be made smaller than that of an in-plane magnetization type. Also, the variance in the easy axis of magnetization can be made smaller. Accordingly, by using a material having a large perpendicular magnetic anisotropy, both miniaturization and lower currents can be expected to be achieved while a thermal disturbance resistance is maintained.

There has been a known technique for achieving a high MR ratio and a high PMA in an MTJ element by forming an underneath MgO tunnel barrier layer and an MgO cap layer that sandwich a recording layer having a pair of amorphous CoFeB ferromagnetic sub-layers, i.e., the first free sub-layer (FL1) and the second free sub-layer (FL2), and a Boron-absorbing sub-layer positioned between them, and performing a thermal annealing process to accelerate crystallization of the amorphous ferromagnetic film to match interfacial grain structure to both the MgO tunnel barrier layer and the MgO cap layer. An MgO layer has a rocksalt crystalline structure in which each of Mg and O atoms forms a separate face-centered cubic (FCC) lattice, and Mg and O atoms together form a simple cubic lattice. The Boron-absorbing sub-layer is typically made of Mo or W material. The recording layer crystallization starts from both the MgO tunnel barrier layer interface and the MgO cap layer interface to its center and forms a CoFe grain structure, which is mainly a body-centered cubic (bcc) crystalline structure, having a volume perpendicular magnetic anisotropy (vPMA), as Boron atoms migrate into the Boron-absorbing sub-layer. In the same time, a typical bcc-CoFe(100)/rocksalt-MgO(100) texture occurs at the interface between a CoFeB sub-layer and an MgO layer. At two MgO interfaces, the orbital hybridization between cobalt 3dz2 and oxygen 2p orbitals significantly lowers the energy of the Co—O bonds, which leads to an interfacial perpendicular magnetic anisotropy. This is the same for a CoFeB reference layer underneath the MgO tunnel barrier layer. Accordingly, a coherent perpendicular magnetic tunneling junction structure is formed as an unique structure: bcc-CoFe(reference-layer)/rocksalt-MgO/bcc-CoFe/(W-boride or Mo-boride)/bcc-CoFe/rocksalt-MgO after a thermal annealing process. By using this technique, both a high MR ratio and a high PMA can be readily achieved. An electric field can change the degree of the orbital hybridization between cobalt (or iron) 3dz2 and oxygen 2p orbitals, as a consequence, the interfacial perpendicular magnetic anisotropy of the free layer can be modified by applying an electric field across the MgO barrier layer.

Magnetization direction of a free layer is used to store the data and can be switched by spin-polarized electrons (equivalently spin current) without a magnetic field. When the spin-polarized current flows through the free layer along a specific direction, the free layer absorbs spin angular momentum from the electrons and as a result, its magnetization direction is reversed when the magnitude of the current is larger than its critical switching current. Furthermore, as the volume of the magnetic layer forming the free layer is smaller, the injected spin-polarized current to write or switch can be also smaller. Accordingly, this method is expected to be a write method that can achieve both device miniaturization and lower currents. However, for random-access-memory (RAM) like applications, this technology faces various challenges along with its merits, such as the reliability of a tunnel barrier, long write latency and small energy efficiency due to still high write current. In theory, the critical switching current with a sufficient long pulse needed to reverse the magnetization direction of the free layer is proportional to its damping constant and the energy barrier between $R_{AP}$ and $R_P$ states, and furthermore, the critical switching current rapidly increases with a shorter pulse. Roughly, the increased amount of the critical current is inversely proportional to the product of the damping constant and the effective PMA field (Hk) of the free layer. Since the PMA of the free layer needs to be sufficiently high to maintain a reasonable thermal stability factor ($E/k_B T$, where E is the product of the PMA and volume of the recording layer and also denotes the energy barrier between the two stable magnetization configurations of the recording layer, $k_B$ is the Boltzmann constant, and T is the absolute temperature 300K) which is normally required to be larger than 70 in the operation temperature range, the current density for switching of perpendicular spin transfer torque MRAM (pSTT-MRAM) is relatively large and hence large transistors are inevitable to drive it, which thus significantly limits their future use for memory applications.

Many other approaches to the electric-field manipulation of spin have been proposed and experimentally demonstrated, such as using the inverse magnetostriction effect in a multilayered stack with piezoelectric materials, the gate controlled Curie temperature in ferromagnetic semiconductors or even in an ultrathin ferromagnetic metal layer, magnetoelectric switching of exchange bias, electric polarization induced control in magnetic anisotropy at the ferromagnetic/ferroelectric interface, electric-field induced magnetic phase transition through structural phase transition, and the utilization of multiferroic materials. For example, it is reported (see Article: Bipolar electric-field switching of perpendicular magnetic tunnel junctions through voltage-controlled exchange coupling, https://arxiv.org/ftp/arxiv/papers/1912/1912.10289.pdf, by Zhang, et al.) that an electric field is able to tune the sign of the interlayer exchange coupling between two ferromagnetic layers in a SAF structure via modulation of the spin reflectivity at the interfaces to achieve a bipolar switch. However, each of these approaches have the drawbacks of limited operation temperature or low write endurance or difficulty in the introduction to magnetoresistive devices. To advance applications toward ultra-low power and GHz write speeds, voltage control of magnetic anisotropy (VCMA) MRAM is a very promising solution. The most common approach of VCMA write consists of two essential components: an electric-field applied across the MgO tunnel barrier (along the direction pointing from the MgO layer to the free layer) to remove or reduce the energy barrier, and an external in-plane magnetic field which induces precession around its axis (see Article: Recent Progress in the Voltage-Controlled Magnetic Anisotropy Effect and the Challenges Faced in Developing Voltage-Torque MRAM, Micromachines 2019, 10, 327. by Nozaki, et al). This mechanism allows reduction of the write energy to femto-joule scales and the write speed, corresponding to the half period of the free-layer (FL) precession, is typically in the range of sub-ns. However, because VCMA effect is unipolar, i.e., the anti-parallel (AP) and parallel (P) states are equally stable and the AP-P and P-AP transitions share the exact same write pulse, a VCMA write could be not deterministic. Therefore, to ensure a desired final state, a pre-read is needed to decide if writing is required. For pure voltage control, the magnetic tunnel junction (MTJ) has a high resistance-area product (RA) in order to reduce a side effect of spin-transfer-torque, which slows the sense time. This sequential read/write operation can significantly increase the write duty cycle. In the meantime, since there is still a probability that the magnetization damps back to the initial, or to be changed to the other state due to the thermal activation, additional write-verify algorithms are generally necessary to guarantee the success of MTJ switching. Currently, the energy consumptions of MRAM devices are still too high for wide adoptions in key applications. Therefore, it is desired to develop new technologies to achieve low write energy while keeping a high thermal stability factor.

SUMMARY OF THE PRESENT INVENTION

A perpendicular magnetoresistive element having a novel recording structure comprises: a free layer and an adjacent-bias layer separated by a nonmagnetic spacing layer, wherein the free layer has an interfacial perpendicular magnetic anisotropy and a variable magnetization direction substantially perpendicular to a film surface, the adjacent-bias layer has a perpendicular magnetic anisotropy and a variable magnetization direction substantially perpendicular to a film surface, and the perpendicular anisotropy of the free layer is sufficiently higher than that of the adjacent-bias layer such that the critical switching current to reverse the free layer magnetization direction is at least 3 times as high as the critical switching current to reverse the adjacent-bias layer magnetization direction.

A toggle writing method of the perpendicular magnetoresistive element comprises: applying a first write pulse having a first voltage magnitude and a first pulse width to reverse the adjacent-bias layer magnetization direction to be anti-parallel to the free layer magnetization direction by spin-transfer-torque effect, and applying a second write pulse having a second voltage magnitude and a second pulse width to reverse the free layer magnetization direction to be parallel to the adjacent-bias layer magnetization direction by voltage-controlled magnetic anisotropy effect under the magnetic dipole bias field from the adjacent-bias layer.

Advantages of the above-described aspects of the invention include, but are not limited to, providing the ability to use the adjacent-bias layer to produce a perpendicular magnetic dipole bias field to assist a voltage-controlled switching process of the free layer magnetization direction, use the first write pulse to switch the adjacent-bias layer magnetization direction through spin-transfer-torque (STT), and use the adjacent-bias layer to assist the process of switching the free layer magnetization direction during the second write pulse through VCMA.

BRIEF DESCRIPTION OF THE DRAWINGS

FIGS. 3(D, E, F) are schematic cross-sectional views showing the magnetization reversing processes in a free layer and an adjacent-bias layer during a two-step toggle writing process from the anti-parallel state to the parallel state in a top-pinned magnetoresistive element 100 in the first embodiment.

FIGS. 6(D, E, F) are schematic cross-sectional views showing the magnetization reversing processes in a free layer and an adjacent-bias layer of the second embodiment during a two-step toggle writing process from the anti-parallel state to the parallel state in a bottom-pinned magnetoresistive element 200.

FIGS. 11(D, E, F) are schematic cross-sectional views showing the magnetization reversing processes in a free layer and an adjacent-bias layer of the fourth embodiment during a two-step toggle writing process from the anti-parallel state to the parallel state in a top-pinned magnetoresistive element.

DETAILED DESCRIPTION OF THE INVENTION

Figure 1:
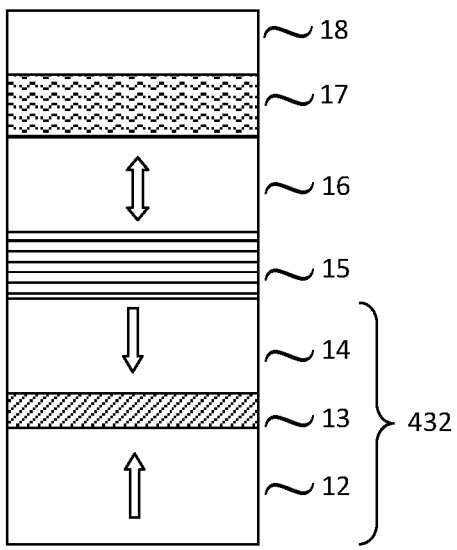
FIG. 1 is a schematic cross-sectional view showing a configuration of an MTJ element 1 in a prior art.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. Here, and thereafter throughout this application, each element written in the left side of "/" is stacked above an element written in the right side thereof.

In general, there is provided a magnetoresistive element comprising: a free layer and an adjacent-bias layer separated by a nonmagnetic spacing layer, wherein the free layer has an interfacial perpendicular magnetic anisotropy and a variable magnetization direction substantially perpendicular to a film surface, the adjacent-bias layer has a perpendicular magnetic anisotropy and a variable magnetization direction substantially perpendicular to a film surface, and the perpendicular anisotropy of the free layer is sufficiently higher than that of the adjacent-bias layer such that the critical switching current to reverse the free layer magnetization direction is at least 3 times as high as the critical switching current to reverse the adjacent-bias layer magnetization direction. At least 80% of the perpendicular magnetic anisotropy energy of the free layer is produced by the interface interaction between the free layer and the tunnel barrier layer, and decreases to zero by the application of a critical bias voltage on the tunnel barrier layer due to the VCMA effect. For practical applications, the critical bias voltage should be no more than 3.0 volts, and is preferred to be no more than 1.6 volts. The free layer and the adjacent-bias layer have a small perpendicular distance between 0.7 nm and 15 nm. Thus, the magnetization of the free layer produces a first magnetic dipole field on the magnetization of the adjacent-bias layer, while the magnetization of the adjacent-bias layer produces a second magnetic dipole field on the magnetization of the free layer. Since at equilibrium, the net magnetization vector lies along the direction of the applied magnetic field, so that the free layer and the adjacent-bias layer have equilibrium magnetizations that are parallel to each other due to their magnetic dipole coupling fields. The first magnetic dipole field is sufficiently small so that the adjacent-bias layer magnetization can be readily switched to be anti-parallel to the free layer magnetization by applying an electric current that is larger than the critical current for spin transfer torque switching of the adjacent-bias layer magnetization direction. The second magnetic dipole field is sufficiently large so that through application of a bias voltage pulse with a magnitude larger than the critical bias voltage on the tunnel barrier, the free layer magnetization switches to be parallel to the adjacent-bias layer magnetization under the second magnetic dipole field. Further, there is provided a toggle writing method of the perpendicular magnetoresistive element comprises: applying a first write pulse having a first voltage magnitude and a first pulse width to reverse the adjacent-bias layer magnetization direction to be anti-parallel to the free layer magnetization direction by spin-transfer-torque effect, and applying a second write pulse having a second voltage magnitude and a second pulse width to reverse the free layer magnetization direction to be parallel to the adjacent-bias layer magnetization direction by voltage-controlled magnetic anisotropy effect under the magnetic dipole field from the adjacent-bias layer.

FIG. 1 is a schematic cross-sectional view showing a configuration of an MTJ element 1 as a prior art, in which arrows represent magnetization directions at equilibrium. The MTJ element 1 is configured by stacking a bottom pinning layer 12, an anti-ferromagnetic coupling (AFC) layer 13, a reference layer 14, a tunnel barrier layer 15, a recording layer 16, a cap layer 17, and a protective layer 18 in this order from the bottom to the top. The bottom pinning layer 12 is typically made of super-lattice multilayer and has a strong perpendicular magnetic anisotropy. The bottom pinning layer 12 and the reference layer 14 are magnetically antiparallel-coupled through the anti-ferromagnetic coupling (AFC) layer 13, forming a reference structure 432. The tunnel barrier layer 15 is made of a non-magnetic insulating metal oxide or nitride. The recording layer 16 is made of ferromagnetic materials and has a magnetic anisotropy in a direction perpendicular to the film surface. The tri-layered structure consisting of the layers 14, 15 and 16 forms a magnetic tunneling junction (MTJ). The recording layer 16 has a variable (reversible) magnetization direction, while the reference layer 14 has an invariable (fixed) magnetization direction. The perpendicular magnetic anisotropic energy of the reference layer 14, partly coming from the antiparallel-coupling with the bottom pinning layer 12, is sufficiently greater than that of the recording layer 16. This strong perpendicular magnetic anisotropy can be achieved by selecting a material, configuration and a film thickness. The perpendicular resistance of the MTJ is high when the magnetizations between the recording layer 16 and the reference layer 14 are anti-parallel; and the perpendicular resistance of the MTJ is low when the magnetizations between the recording layer 16 and the reference layer 14 are parallel. Also in this manner, a spin polarized current may only reverse the magnetization direction of the recording layer 16 while the magnetization direction of the reference layer 14 remains unchanged. The cap layer 17 is a metal oxide layer and serves to introduce an interfacial perpendicular magnetic anisotropy for the recording layer 16. As an amorphous ferromagnetic material, CoFeB, in the recording layer is thermally annealed, a crystallization process occurs to form bcc CoFe grains having epitaxial growth with (100) plane parallel to surface of the tunnel barrier layer. The (100) texture extends across the whole stack from the tunnel barrier layer to the cap layer, producing a desired perpendicular magnetic anisotropy for the recording layer.

First Embodiment of Current Invention

Figure 2:
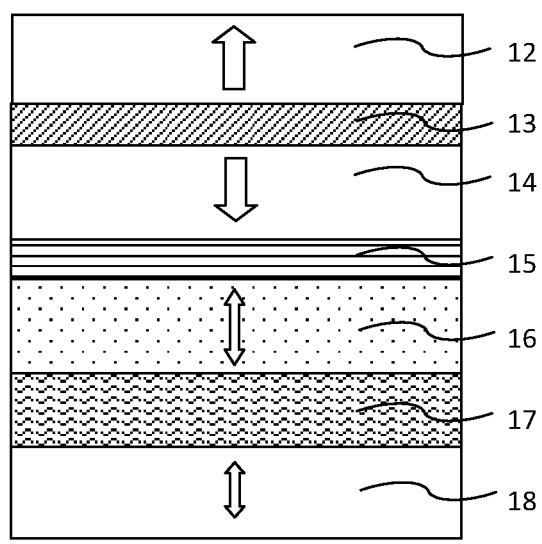
FIG. 2 is a schematic cross-sectional view showing a configuration of a top-pinned magnetoresistive element 100 in a first embodiment.

FIG. 2 is a schematic cross-sectional view showing a configuration of a magnetoresistive element 100 as deposited according to the first embodiment in this invention. The magnetoresistive element 100 is configured by stacking a reference structure including a pinning layer 12, an anti-ferromagnetic coupling (AFC) layer 13 and a reference layer 14, a tunnel barrier layer 15, a free layer 16, a nonmagnetic spacing layer 17 and an adjacent-bias layer 18 in the order from top to bottom.

In above embodiment, the free layer is made of a ferromagnetic material and has an interfacial perpendicular anisotropy from its interface with the tunnel barrier layer. Similar to the free layer, the adjacent-bias layer is made of a ferromagnetic material but has a much smaller perpendicular anisotropy than the free layer. Magnetizations of the free layer and the adjacent-bias layer are magnetically coupled across the nonmagnetic spacing layer mainly via a dipole coupling. The nonmagnetic spacing layer has a thickness between 1 nm and 5 nm, and is made of a nonmagnetic material so that there are spin transfer torque effects between the free layer and the adjacent-bias layer. Both of the free layer and the adjacent-bias layer have variable (reversible) magnetization directions. The reference structure is a synthetic anti-ferromagnetic structure having a perpendicular magnetic anisotropic energy which is sufficiently greater than both of the free layer and the adjacent-bias layer so that both the pinning layer and the reference layer have invariable (fixing) magnetization directions. The stray field on the free layer generated by the reference structure is minimized by properly adjusting the magnetic moments of the pinning layer and the reference layer, and an electric current may only reverse the magnetization direction of the free layer or the adjacent-bias layer while the magnetizations of the reference structure remain unchanged. The stray magnetic field on the free layer generated by the reference structure is less than one third of the second magnetic dipole field on the free layer by the adjacent-bias layer.

In a typical memory application, a bit-line is connected to a top electrode of the magnetoresistive element and a select-transistor is connected to a bottom electrode of the magnetoresistive element. A positive voltage suggests that the voltage of the top electrode is higher than that of the bottom electrode. Since a tunnel barrier layer contributes a majority of electrical resistance of a magnetoresistive element, the tunnel barrier layer has most of the voltage bias. Under the application of a positive voltage bias, the PMA of the free layer 16 is suppressed since the interfacial perpendicular magnetic anisotropy comes from its top interface with the tunnel barrier layer 15. On the other hand, the application of a negative voltage enhances the PMA.

Figure 3A:
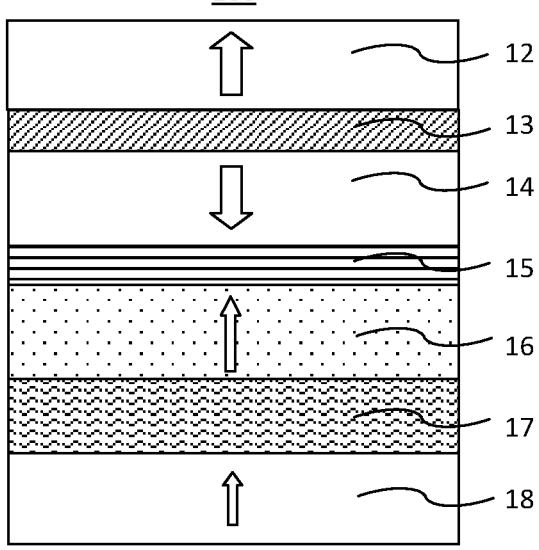
FIGS. 3(A, B, C) are schematic cross-sectional views showing the magnetization reversing processes in a free layer and an adjacent-bias layer during a two-step toggle writing process from the parallel state to the anti-parallel state in a top-pinned magnetoresistive element 100 in the first embodiment.
Figure 3B:
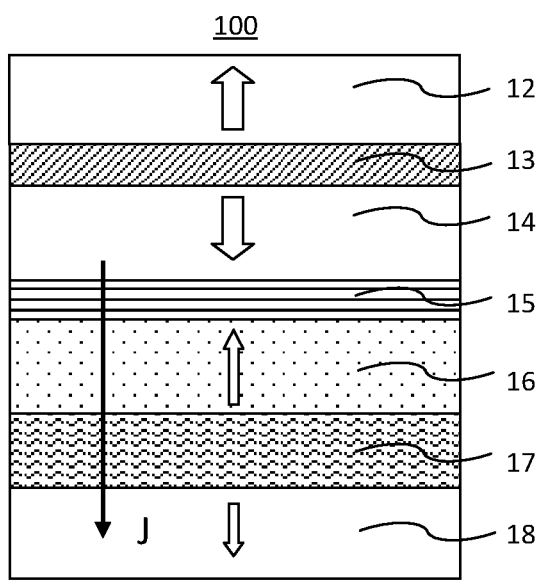
Figure 3C:
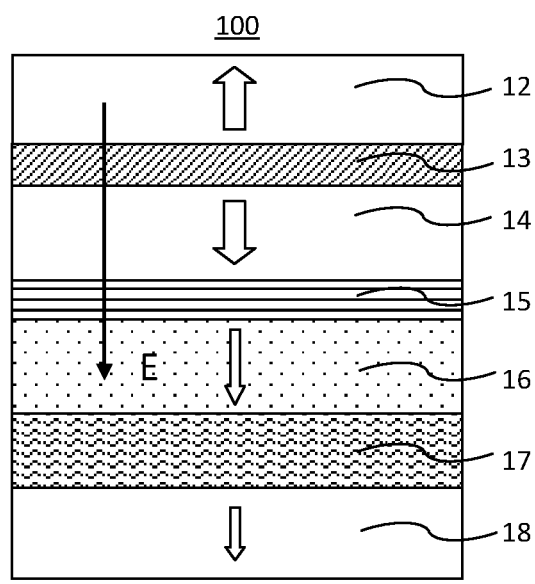

FIGS. 3(A, B, C) are schematic cross-sectional views showing the magnetization reversing processes in a free layer and an adjacent-bias layer during a two-step toggle writing process from the parallel state (as shown in FIG. 3A) to the anti-parallel state in above top-pinned magnetoresistive element 100 of the first embodiment. Wide open arrows represent magnetization directions at equilibrium in different layers, and narrow solid arrows represent electric current directions or write voltage (electric field) directions. The flow of electrons is opposite to the electric current direction. The toggle writing scheme consists of writing pulses with two different voltage levels, as shown in FIG. 4A. The beginning part is a spin-transfer-torque pre-writing, in which a first writing pulse is applied to the perpendicular magnetoresistive element with a proper magnitude and a sufficient long duration so that the amount of minority spin electrons reflected at the bottom surface of the free layer, polarized to the opposite direction of the adjacent-bias layer magnetization (i.e., exerting spin transfer torque on the adjacent-bias layer magnetization), is sufficient to switch the magnetization direction of the adjacent-bias layer, and the amount of spin torque electrons being generated from the switched adjacent-bias layer and the reference layer is insufficient to initiate a process of switching the magnetization direction of the free layer, as show in FIG. 3B. After switching, the reversed magnetization of the adjacent-bias layer generates a dipole field or a bias field on the free layer, which is anti-parallel to the free layer magnetization direction. Immediately after the first writing pulse, a second writing pulse is applied to the perpendicular magnetoresistive element has a sufficient large magnitude and a sufficient short duration so that the voltage bias on the tunnel barrier layer is sufficient to reduce the interfacial perpendicular magnetic anisotropy of the free layer, which causes the magnetization of the free layer reverse under the magnetic dipole field generated by the adjacent-bias layer. Finally both magnetizations of the free layer and the adjacent-bias layer have been switched and aligned again in a parallel direction, as shown in FIG. 3C, which is a stable state. Since the free layer is switched by combining the magnetic dipole bias field from the STT pre-writing switched adjacent-bias layer and the VCMC effect, the free layer is preferred to have a high damp constant in order to have a fast switch of magnetization direction and a small STT effect on the free layer. For this purpose, the free layer may have a thin insertion layer of heavy metal elements or be doped with heavy metal elements in order to increase its damping constant. A good candidate of doping elements includes Pt, Pd, Ni, Rh, Ir, Re and alloy thereof. For example, an Ir-doped CoFeB layer has an enhanced damping constant and also has a greatly enhanced VCMA effect. This holds true for free layers in all embodiments in this invention.

Figure 3D:
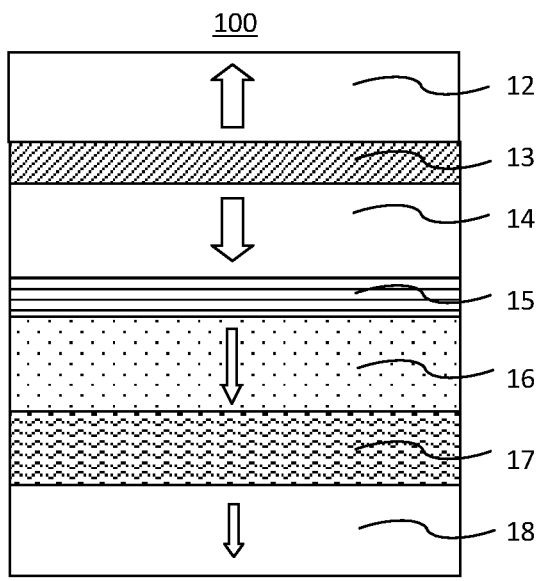
Figure 3E:
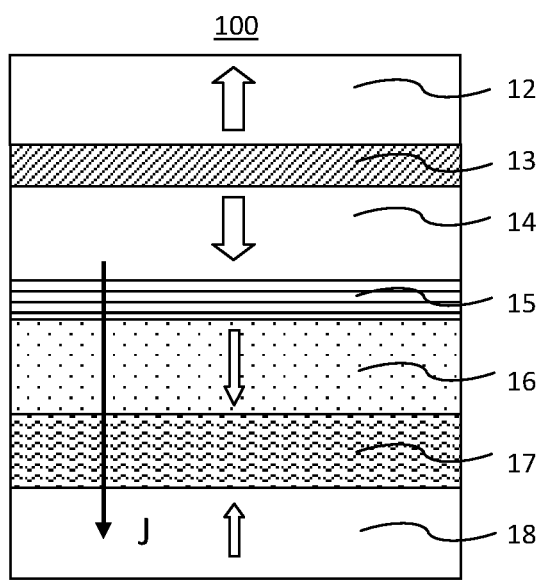
Figure 3F:
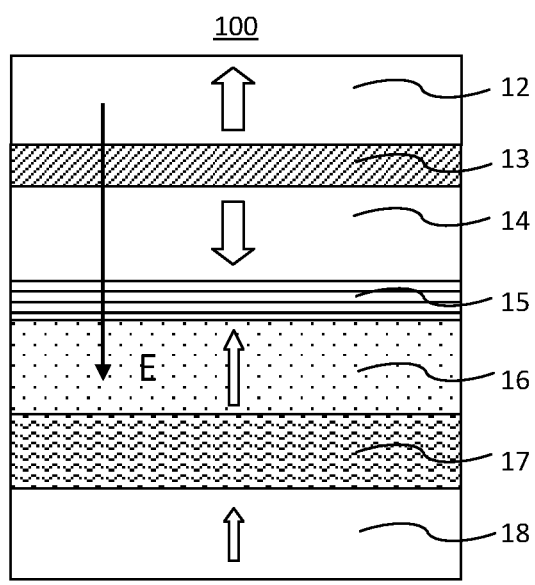
Figure 4A:
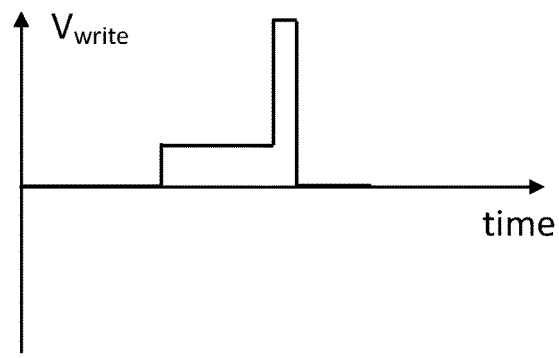
FIGS. 4(A, B) are electric current pulses applied to a top-pinned magnetoresistive element in the first embodiment for a writing and a reading, respectively, and FIG. 4(C, D) are electric current pulses applied to a top-pinned magnetoresistive element in the first embodiment for pre-read writing processes.

FIGS. 3(D, E, F) are schematic cross-sectional views showing the magnetization reversing processes in a free layer and an adjacent-bias layer during a two-step toggle writing process from the anti-parallel state (as shown in FIG. 3D) to the parallel state in above top-pinned magnetoresistive element 100 in the first embodiment. The toggle writing scheme consists of two-step writing pulses, as shown in FIG. 4A. At beginning, a first writing pulse is applied to the perpendicular magnetoresistive element with a proper magnitude and a sufficient long duration so that the amount of minority spin electrons reflected at the bottom surface of the free layer, polarized to the opposite direction of the adjacent-bias layer magnetization (i.e., exerting spin transfer torque on the adjacent-bias layer magnetization), is sufficient to switch the magnetization direction of the adjacent-bias layer, and the amount of spin torque electrons being generated in the switched adjacent-bias layer and the reference layer is insufficient to initiate a process of switching the magnetization direction of the free layer, as shown in FIG. 3E. The reversed magnetization of the adjacent-bias layer generates a dipole field on the free layer, which is anti-parallel to the free layer magnetization direction. Immediately after the first writing pulse, a second writing pulse is applied to the perpendicular magnetoresistive element has a sufficient large magnitude and a sufficient short duration so that the voltage bias on the tunnel barrier layer is sufficient to reduce the interfacial perpendicular magnetic anisotropy of the free layer, which causes the magnetization of the free layer reverse under the magnetic dipole bias field generated by the adjacent-bias layer, as shown in FIG. 3F. The second writing pulse voltage is at least two thirds of the critical bias voltage on the tunnel barrier.

Figure 4B:
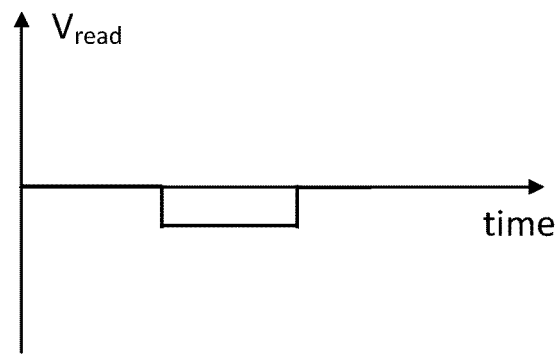
Figure 4C:
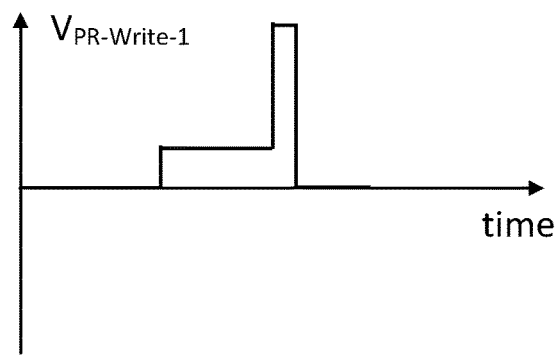
Figure 4D:
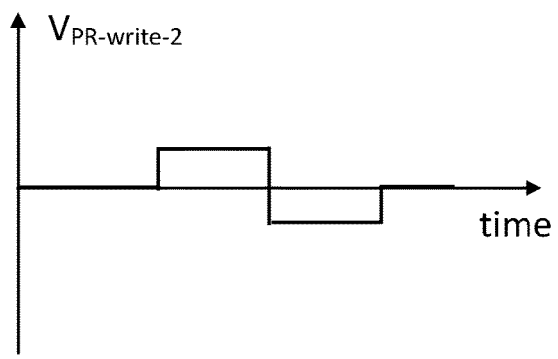

After writing processes as described above, magnetizations of both the free layer and the adjacent-bias layer are in stable energy minimum states. For a reading process, an electric reading pulse is applied with a smaller magnitude and a proper pulse width along a direction opposite to writing pulses, as shown in FIG. 4B. In fact, the reading pulse would slightly enhance the interfacial perpendicular magnetic anisotropy of the free layer to make it more stable. Since every writing pulse would reverse the free layer magnetization, it is necessary that a pre-read is conducted before each writing process: only if the read bit of the current state of the free layer is different from the targeted state which is intended to write to, a writing process is performed; otherwise, aborting performing both applications of the first write pulse and the second write pulse if the read bit of the current state of the free layer is the same as the target state. Alternatively, the pre-read pulse and the first write pulse may be combined together. FIG. 4C shows a pre-read writing pulse in which the reading result during the first write pulse suggests that a second write is needed, while FIG. 4D shows a pre-read write pulse in which the first pulse reading result suggests a second write is not needed, instead, a restoring pulse is needed to bring the adjacent-bias layer magnetization back to its original state. In more details, a reading process is performed simultaneously during the first write pulse to determine whether the state of the free layer is the same as the target state. If the reading process determines that the state of the free layer is the same as the target state, it is then required to perform an application of a second writing pulse having a second voltage and a second duration to the perpendicular magnetoresistive element so that the amount of spin polarization electrons flowing into the adjacent-bias layer is insufficient to initiate a process of switching the magnetization direction of the adjacent-bias layer, and the first perpendicular magnetic anisotropy is sufficiently reduced to lead a switch of the free layer magnetization direction to be aligned parallel to the adjacent-bias layer magnetization direction under the second magnetic dipole field. On the other hand, if the reading process determines that the state of the free layer is not the same as the target state, it is required to perform an application of a back-writing pulse having a first voltage of an opposite sign and the first duration to the perpendicular magnetoresistive element so that the amount of spin polarization electrons flowing into the free layer is insufficient to initiate a process of switching the magnetization direction of the free layer, and the amount of spin polarized electrons flowing into the adjacent-bias layer is sufficient to switch the magnetization direction of the adjacent-bias layer back to be aligned parallel to the free layer magnetization direction, where the second write pulse is applied immediately after the first write pulse, the second voltage is at least two thirds of the critical bias voltage.

Second Embodiment of Current Invention

Figure 5:
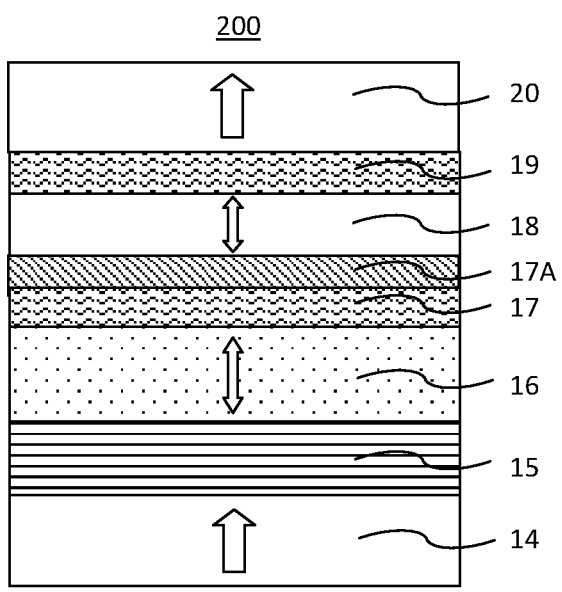
FIG. 5 is a schematic cross-sectional view showing a configuration of a bottom-pinned magnetoresistive element 200 in a second embodiment.

FIG. 5 is a cross-sectional view showing a schematic configuration of a bottom-pinned magnetoresistive element 200 in the second embodiment. The magnetoresistive element 200 is configured by stacking a first reference layer 14, a tunnel barrier layer 15, a free layer 16, a nonmagnetic material layer 17, a spin-decoupling layer 17A, an adjacent-bias layer 18, a nonmagnetic layer 19 and a second reference layer 20 in the order from bottom to top.

In the second embodiment, the free layer is made of a ferromagnetic material and has an interfacial perpendicular anisotropy from its interface with the tunnel barrier layer. Similar to the free layer, the adjacent-bias layer is made of a ferromagnetic material but has a much smaller perpendicular anisotropy than the free layer. Magnetizations of the free layer and the adjacent-bias layer are magnetically coupled across the nonmagnetic material layer and the spin-decoupling layer mainly via a dipole coupling. Both of the free layer and the adjacent-bias layer have variable (reversible) magnetization directions. Both the first reference structure and the second reference structure (not shown here) are made by synthetic anti-ferromagnetic structures having a perpendicular magnetic anisotropic energy which is sufficiently greater than both of the free layer and the adjacent-bias layer. The net stray field on the free layer generated by both the first and the second reference structures is minimized, and an electric current may only reverse the magnetization direction of the free layer or the adjacent-bias layer while the magnetizations of the reference structures remain unchanged. The nonmagnetic material layer and the spin-decoupling layer together block polarized spin diffusion between the free layer and the adjacent-bias layer through having spin-scattering effect, i.e., there is no or negligible spin-transfer-torque effect between these two magnetic layers. Instead, there is a spin-transfer-torque effect between the second reference layer and the adjacent-bias layer, which is used for write processes as described in next paragraph. In a preferred structure, the nonmagnetic spin-decoupling layer 17A has a thickness between 2 nm and 10 nm, and is made of a multilayer having spin-scattering effect so that the free layer and the adjacent-bias layer have near zero spin transfer torque effects. The second reference layer 20 is a spin-polarization structure having a stray magnetic field less than one third of the second magnetic dipole field on the free layer, where the spin-polarization structure is a synthetic anti-ferromagnetic structure comprising a first magnetic material layer and a second magnetic material layer separated by a second anti-ferromagnetic coupling (AFC) layer, wherein the first magnetic material layer and a second magnetic material layer have invariable magnetization directions substantially perpendicular to a film surface.

Figure 6A:
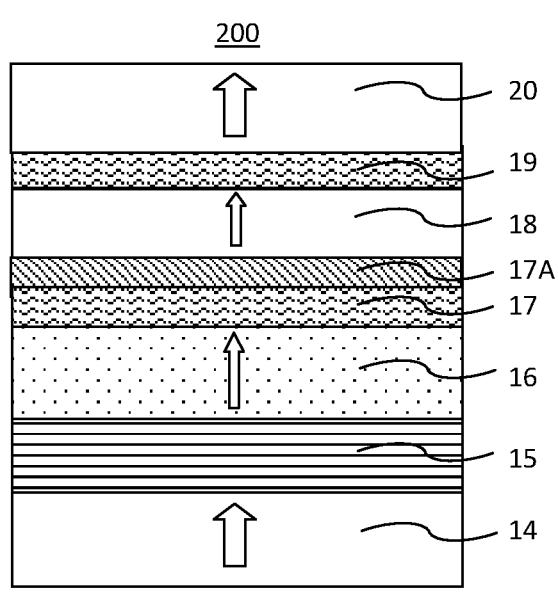
FIGS. 6(A, B, C) are schematic cross-sectional views showing the magnetization reversing processes in a free layer and an adjacent-bias layer of the second embodiment during a two-step toggle writing process from the parallel state to the anti-parallel state in a bottom-pinned magnetoresistive element 200.
Figure 6B:
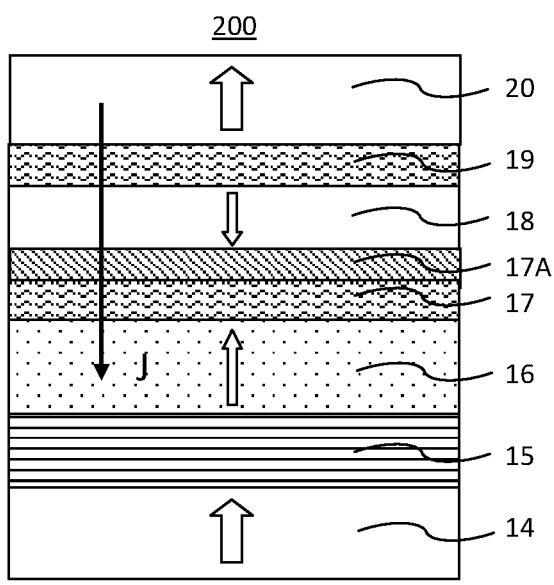
Figure 6C:
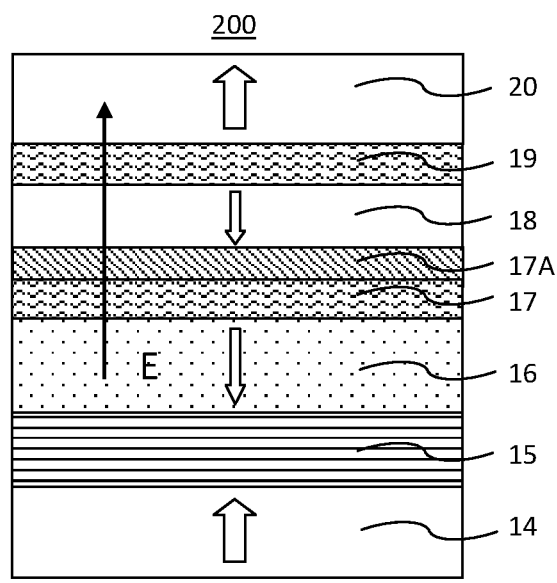
Figure 7A:
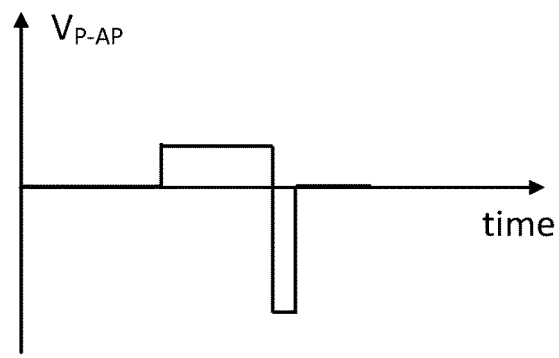
FIGS. 7(A, B) are electric current pulses applied to a bottom-pinned magnetoresistive element in the second embodiment for the P-AP writing and the AP-P writing, respectively.
FIG. 7(C) is an electric current pulse for reading process.

FIGS. 6(A, B, C) are schematic cross-sectional views showing the magnetization reversing processes in a free layer and an adjacent-bias layer during a two-step toggle writing process from the parallel state (as shown in FIG. 6A) to the anti-parallel state in above bottom-pinned magnetoresistive element 200 in the second embodiment. The toggle writing scheme consists of two-step writing, as shown in FIG. 7A. A first write pulse is applied to the perpendicular magnetoresistive element with a proper magnitude and a sufficient long duration so that the amount of minority spin electrons reflected at the bottom surface of the second reference layer, polarized to the opposite direction of the adjacent-bias layer magnetization (i.e., exerting spin transfer torque on the adjacent-bias layer magnetization), is sufficient to switch the magnetization direction of the adjacent-bias layer, and the magnetization direction of the free layer is stable, as shown in FIG. 6B. The reversed magnetization of the adjacent-bias layer generates a dipole field on the free layer, which is anti-parallel to the free layer magnetization direction. Immediately after the first write pulse, a second writing pulse is applied to the perpendicular magnetoresistive element in an opposite direction and has a sufficient large magnitude and a sufficient short duration so that the voltage drop on the tunnel barrier layer is sufficient to reduce the interfacial perpendicular magnetic anisotropy of the free layer, which causes the magnetization of the free layer reverse under the magnetic dipole field generated by the adjacent-bias layer. After the toggle writing, both magnetizations of the free layer and the adjacent-bias layer have been switched and aligned again in the same direction which is a stable state, as shown in FIG. 6C.

Figure 7B:
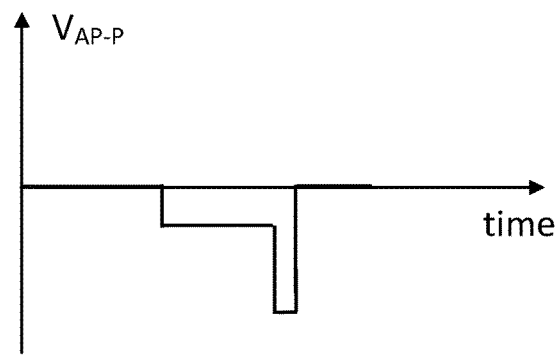

FIGS. 6(D, E, F) are schematic cross-sectional views showing the magnetization reversing processes in a free layer and an adjacent-bias layer during a two-step toggle writing process from the anti-parallel state (as shown in FIG. 6D) to the parallel state in above bottom-pinned magnetoresistive element 200 in the second embodiment. The toggle writing scheme consists of two-step writing, as shown in FIG. 7B. At beginning, a first write pulse is applied to the perpendicular magnetoresistive element with a proper magnitude and a sufficient long duration so that the amount of spin torque electrons being generated in the second reference layer is sufficient to switch the magnetization direction of the adjacent-bias layer, and the magnetization direction of the free layer is stable, as shown in FIG. 6E. The reversed magnetization of the adjacent-bias layer generates a dipole field on the free layer, which is anti-parallel to the free layer magnetization direction. Second, a writing pulse is applied to the perpendicular magnetoresistive element has a sufficient large magnitude and a sufficient short duration so that the voltage drop on the tunnel barrier layer is sufficient to reduce the interfacial perpendicular magnetic anisotropy of the free layer, which causes the magnetization of the free layer reverse under the magnetic dipole field generated by the adjacent-bias layer, as shown in FIG. 6F.

Figure 7C:
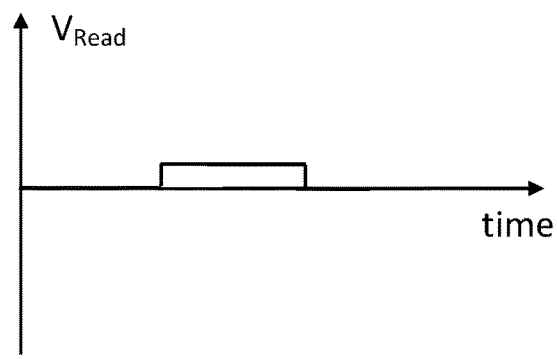

After write processes as described above, magnetizations of both the free layer and the adjacent-bias layer are in stable energy minimum states. For a reading process, an electric read pulse is applied with much smaller magnitude and a proper pulse width, as shown in FIG. 7C. Similar to the first embodiment, the read pulse would slightly enhance the interfacial perpendicular magnetic anisotropy of the free layer to make it more stable. Since the write pulses are different between the AP-P switching and the P-AP switching, a pre-read is not needed before each write process. Once the read result shows P-state, it may unintentionally switches the adjacent-bias layer magnetization direction due to its small perpendicular anisotropy, and a restoring pulse may be required to switch the adjacent-bias layer magnetization direction back to its original stable state.

Third Embodiment of Current Invention

Figures 8, 9:
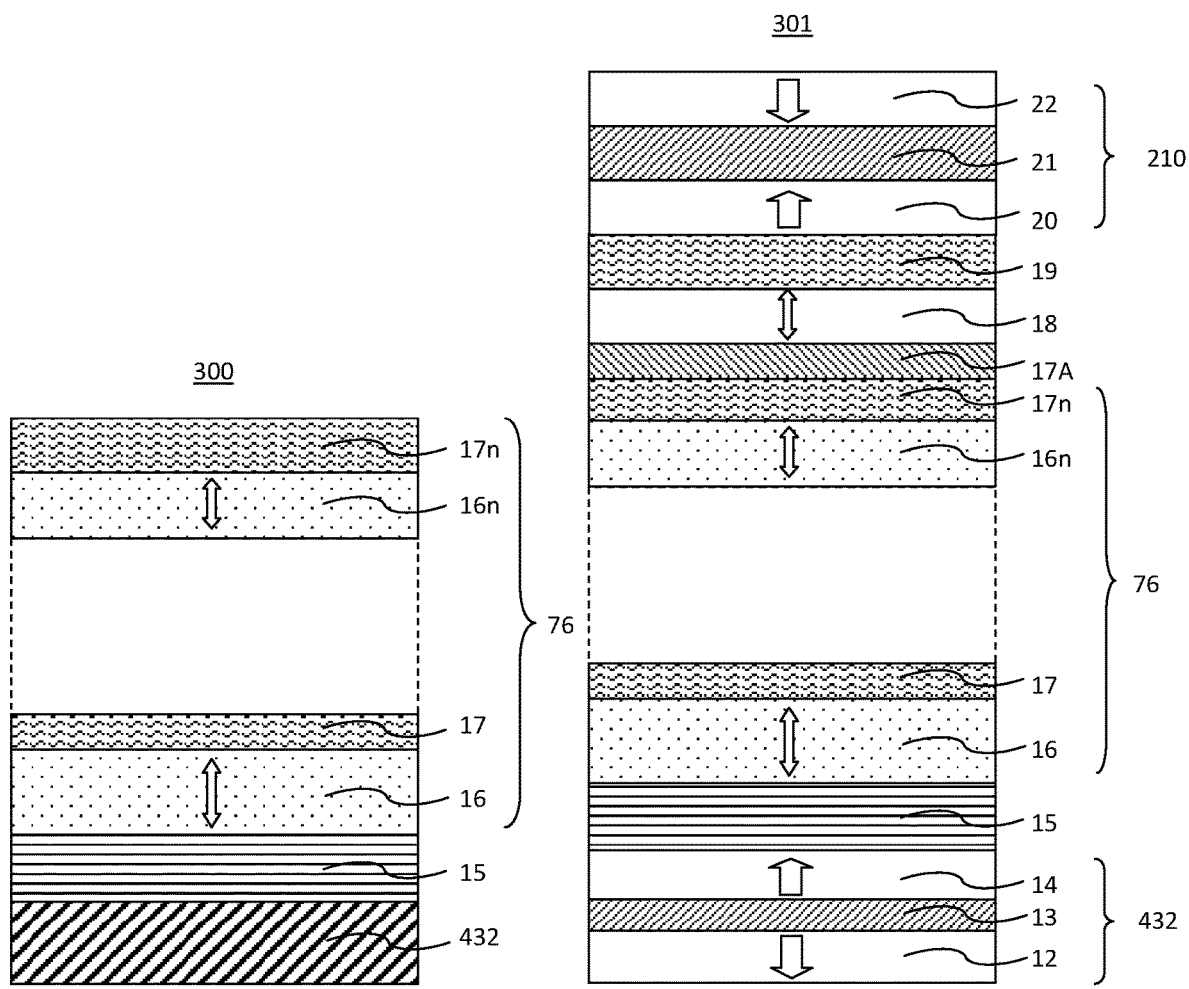
FIG. 8 is a schematic cross-sectional view showing a configuration of a bottom-pinned magnetoresistive element 300 in a third embodiment.
FIG. 9 is a schematic cross-sectional view showing a configuration of a bottom-pinned magnetoresistive element 301 including a first synthetic reference structure and a second reference structure in the third embodiment.

FIG. 8 is a schematic cross-sectional view showing a configuration of a free multilayer 76 in a bottom-pinned magnetoresistive element 300 in the third embodiment. A tunnel barrier 15 is atop of a reference structure 432. The free multilayer 76 atop of the tunnel barrier layer 15 has two or more repeats of a substructure including of a free material layer and a nonmagnetic material layer. The first substructure includes a first free material layer 16 and a first nonmagnetic material layer 17, and the last substructure includes a last free material layer 16n and a last nonmagnetic material layer 17n.

FIG. 9 is a schematic cross-sectional view showing a configuration of a bottom-pinned magnetoresistive element 301 including a first synthetic reference structure and a second reference structure in the third embodiment. The magnetoresistive element 301 is configured by stacking a first synthetic reference structure 432, a tunnel barrier layer 15, a free multilayer 76, a spin-decoupling layer 17A, an adjacent-bias layer 18, a nonmagnetic spacing layer 19, a second synthetic reference structure 210 in the order from bottom to top. The first synthetic reference structure 432 consists of a first pinning layer 12, a first AFC layer 13 and a first reference layer 14. The second synthetic reference structure 210 consists of a second pinning layer 22, a second AFC layer 21 and a second reference layer 20. The write scheme is the same as in the second embodiment, except the free multi-layer produces a higher thermal stability.

Fourth Embodiment of Current Invention

Figure 10:
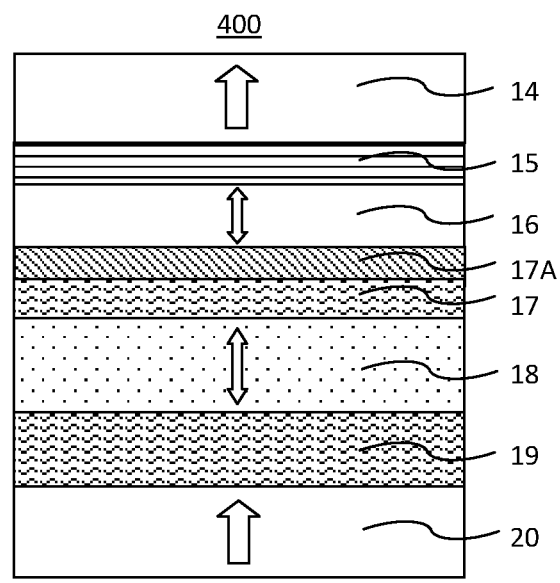
FIG. 10 is a schematic cross-sectional view showing a configuration of a top-pinned magnetoresistive element 400 in a fourth embodiment.

FIG. 10 is a schematic cross-sectional view showing a configuration of a top-pinned magnetoresistive element 400 in a fourth embodiment. The magnetoresistive element 400 is configured by stacking reference layer 14, a tunnel barrier layer 15, a free multilayer 16, a nonmagnetic material layer 17, a spin-decoupling layer 17A, an adjacent-bias layer 18, a nonmagnetic spacing layer 19 and a second reference layer 20 in the order from top to bottom.

FIGS. 11(A, B, C) are schematic cross-sectional views showing the magnetization reversing processes in a free layer and an adjacent-bias layer of the second embodiment during a two-step toggle writing process from the parallel state (as shown in FIG. 11A) to the anti-parallel state in above bottom-pinned magnetoresistive element 400. The toggle writing scheme consists of two-step writing. At beginning, a first write pulse is applied to the perpendicular magnetoresistive element with a proper magnitude and a sufficient long duration so that the amount of minority spin electrons reflected at the top surface of the second reference layer, polarized to the opposite direction of the adjacent-bias layer magnetization (i.e., exerting spin transfer torque on the adjacent-bias layer magnetization), is sufficient to switch the magnetization direction of the adjacent-bias layer, and the magnetization direction of the free layer is stable, as shown in FIG. 11B. The reversed magnetization of the adjacent-bias layer generates a dipole field on the free layer, which is anti-parallel to the free layer magnetization direction. Then, a second writing pulse is applied to the perpendicular magnetoresistive element with a sufficient large magnitude and a sufficient short duration so that the voltage drop on the tunnel barrier layer is sufficient to reduce the interfacial perpendicular magnetic anisotropy of the free layer, which causes the magnetization of the free layer reverse under the magnetic dipole field generated by the adjacent-bias layer. Finally both magnetizations of the free layer and the adjacent-bias layer have been switched and aligned again in the same direction which is a stable state, as shown in FIG. 11C.

Figure 11D:
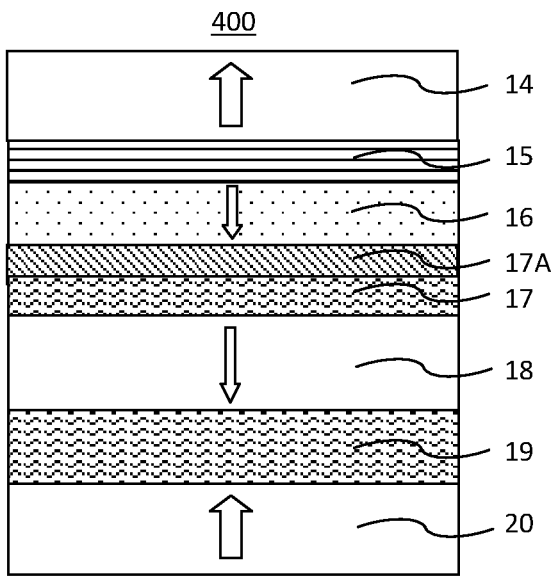
FIGS. 11(A, B, C) are schematic cross-sectional views showing the magnetization reversing processes in a free layer and an adjacent-bias layer of the fourth embodiment during a two-step toggle writing process from the parallel state to the anti-parallel state in a top-pinned magnetoresistive element.
Figure 11E:
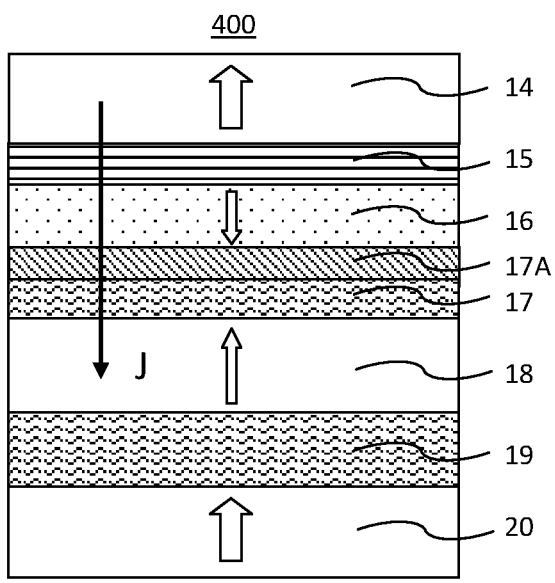
Figure 11F:
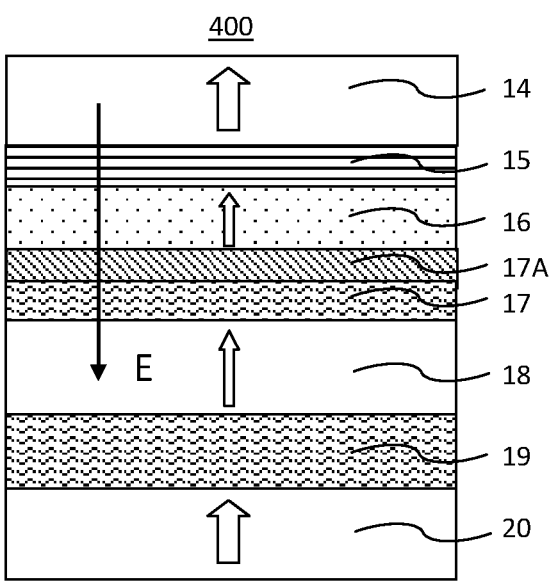

FIGS. 11(D, E, F) are cross-sectional views showing the magnetization reversing processes in a free layer and an adjacent-bias layer of the second embodiment during a two-step toggle writing process from the anti-parallel state (as shown in FIG. 11D) to the parallel state in above bottom-pinned magnetoresistive element 400. The toggle writing scheme consists of two-step writing. First, a write pulse is applied to the perpendicular magnetoresistive element with a proper magnitude and a sufficient long duration so that the amount of spin torque electrons being generated in the second reference layer is sufficient to switch the magnetization direction of the adjacent-bias layer, and the magnetization direction of the free layer is stable, as shown in FIG. 11E. The reversed magnetization of the adjacent-bias layer generates a dipole field on the free layer, which is anti-parallel to the free layer magnetization direction. Second, a writing pulse is applied to the perpendicular magnetoresistive element has a sufficient large magnitude and a sufficient short duration so that the voltage drop on the tunnel barrier layer is sufficient to reduce the interfacial perpendicular magnetic anisotropy of the free layer, which causes the magnetization of the free layer reverse under the magnetic dipole bias field generated by the adjacent-bias layer, as shown in FIG. 11F.

In all embodiments, the tunnel barrier layer is preferred to be made of MgO or MgAlO, MgZnO and MgZrO, and the free layer may comprise a first magnetic sub-layer, preferred to be CoFeB, CoFeB/Fe, Fe/CoFeB, CoFeB/FeB, FeB/CoFeB, CoFeB/CoB, CoB/CoFeB, CoFe/CoFeB or CoFeB/CoFe, and a second magnetic sub-layer, preferred to be CoFeB or CoB, wherein the Boron (B) atomic percentage is between 10% and 35%, and a Boron-absorbing sub-layer provided between the first magnetic sub-layer and the second magnetic sub-layer and containing at least one element selected from the group of Ta, Hf, Zr, Ti, Mg, Nb, W, Mo, Ru, Al, Ir, Pt, Pd. When a thermal annealing process is applied after the MTJ stack deposition, as Boron elements migrate to the middle Ta (or W, Mo, etc) atoms to form Ta boride (or W boride, Mo boride, etc), a crystallization process of the free layer occurs to form body-centered cubic (bcc) CoFe grains having an epitaxial growth. Here the CoFeB material in the free layer may be doped with heavy metal elements, such as Ir, Pt, Pd, etc. for a higher damping constant and a higher VCMA efficiency. It is preferred that the free layer has a damping constant of 0.01 or greater. The adjacent-bias layer has a sufficiently small perpendicular magnetic anisotropy such that a spin polarized current with a moderate magnitude may only reverse the magnetization direction of the adjacent-bias layer while the magnetization direction of the free layer remains unchanged. The adjacent-bias layer can be also made of a multilayer having magnetic sub-layers interleaved by nonmagnetic spacing sub-layers, and magnetizations of magnetic sub-layers are ferromagnetically parallel-coupled across nonmagnetic spacing layers but individually switchable by sufficiently large spin transfer torques. As a result, the critical write current at a short pulse is reduced for the adjacent-bias layer. The reference structure can be made of CoFeB(around 1 nm)/W(around 0.2 nm)/Co(0.5 nm)/Ir(0.4-0.6 nm)/Co(0.5 nm)/[Pt/Co]$_3$/Pt.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetoresistive element for being used in a magnetic memory device comprising:
   a reference layer having an invariable magnetization direction substantially perpendicular to a film surface;
   a tunnel barrier layer provided on a surface of the reference layer;
   a recording structure comprising:
      a free layer provided on a surface of the tunnel barrier layer which is opposite to a surface of the tunnel barrier layer where the reference layer is provided, and having a first perpendicular magnetic anisotropy energy that is mainly produced from interface interaction between the free layer and the tunnel barrier layer and decreases to zero by the application of a critical bias voltage on the tunnel barrier layer, and a variable magnetization direction, a first critical current for spin transfer torque switching;
      an adjacent-bias layer having a second perpendicular magnetic anisotropy energy and a variable magnetization direction, a second critical current for spin transfer torque switching;
      wherein the first critical current for spin transfer torque switching of the free layer is at least 3 times as high as the second critical current for spin transfer torque switching of the adjacent-bias layer, the free layer and the adjacent-bias layer have a perpendicular distance between 0.7 nm and 15 nm, the free layer produces a first magnetic dipole field on the adjacent-bias layer, the adjacent-bias layer produces a second magnetic dipole field on the free layer.

2. The element of claim 1, wherein the tunnel barrier layer consists of one of MgO, MgZnO, MgZrO and MgAlO.

3. The element of claim 1, wherein the free layer comprises at least one ferromagnetic Boron alloy layer selected from the group of CoFeB, CoB, and FeB, wherein the Boron has an atomic percentage is between 10% and 35%.

4. The element of claim 1, wherein the free layer comprises a first magnetic sub-layer, preferred to be CoFeB, CoFeB/Fe, Fe/CoFeB, CoFeB/FeB, FeB/CoFeB, CoFeB/CoB, CoB/CoFeB, CoFe/CoFeB or CoFeB/CoFe, and a second magnetic sub-layer, preferred to be CoFeB or CoB, and a Boron-absorbing sub-layer provided between the first magnetic sub-layer and the second magnetic sub-layer and containing at least one element selected from the group of Ta, Hf, Zr, Ti, Mg, Nb, W, Mo, Ru, Al, Ir, Pt, Pd.

5. The element of claim 1, wherein the free layer has a damping constant of 0.01 or greater.

6. The element of claim 1, wherein the free layer has a thin insertion layer of heavy metal elements or is doped with heavy metal elements.

7. The element of claim 1, wherein at least 80% of the first perpendicular magnetic anisotropy energy is produced by the interface interaction between the free layer and the tunnel barrier layer produces.

8. The element of claim 1, wherein the critical bias voltage is no more than 3.0 volts.

9. The element of claim 1, wherein the critical bias voltage is no more than 1.6 volts.

10. The element of claim 1, wherein the first magnetic dipole field and the second magnetic dipole field are sufficiently large so that the free layer and the adjacent-bias layer coupled together to have equilibrium magnetizations that are parallel to each other in the absence of external fields and electric currents.

11. The element of claim 1, wherein the first magnetic dipole field is sufficiently small so that the adjacent-bias layer magnetization switches to be anti-parallel to the free layer magnetization by an applied electric current that is larger than the critical current for spin transfer torque switching of the adjacent-bias layer magnetization direction.

12. The element of claim 1, wherein the second magnetic dipole field is sufficiently large so that through application of a bias voltage pulse with a magnitude larger than the critical bias voltage on the tunnel barrier, the free layer magnetization switches to be parallel to the adjacent-bias layer magnetization under the second magnetic dipole field.

13. The element of claim 1, further comprising a first anti-ferromagnetic coupling (AFC) layer provided on a surface of the reference layer which is opposite to a surface of the reference layer where the tunnel barrier layer is provided, and a pinning layer provided on a surface of the AFC layer which is opposite to a surface of the AFC layer where the reference is provided, wherein the pinning layer and the reference layer form an anti-ferromagnetic structure producing a stray magnetic field less than one third of the second magnetic dipole field on the free layer.

14. The element of claim 1, further comprising a nonmagnetic spacing layer sandwiched by the free layer and the adjacent-bias layer, wherein the nonmagnetic spacing layer has a thickness between 1 nm and 5 nm, and is made of a nonmagnetic material so that the free layer and the adjacent-bias layer have spin transfer torque effects.

15. The element of claim 1, further comprising a first nonmagnetic layer sandwiched by the free layer and the adjacent-bias layer, wherein the first nonmagnetic layer has a thickness between 2 nm and 10 nm, and is made of a multilayer having spin-scattering effect so that the free layer and the adjacent-bias layer have near zero spin transfer torque effects.

16. The element of claim 15, further comprising a second nonmagnetic layer on a surface of the adjacent-bias layer which is opposite to a surface of the adjacent-bias layer where the first nonmagnetic layer is provided, and a spin-polarization structure provided on a surface of the second nonmagnetic layer which is opposite to a surface of the second nonmagnetic layer where the adjacent-bias is provided and having a stray magnetic field less than one third of the second magnetic dipole field on the free layer, wherein the adjacent-bias layer and the spin-polarization structure have spin transfer torque effects.

17. The element of claim 16, wherein the spin-polarization structure is a synthetic anti-ferromagnetic structure comprising a first magnetic material layer and a second magnetic material layer separated by a second anti-ferromagnetic coupling (AFC) layer, wherein the first magnetic material layer and a second magnetic material layer have invariable magnetization directions substantially perpendicular to a film surface.

18. A write method of a magnetic memory device having a circuitry and a magnetoresistive element comprising: a tunnel barrier layer provided on a surface of the reference layer; a recording structure comprising a free layer provided on a surface of the tunnel barrier layer which is opposite to a surface of the tunnel barrier layer where the reference layer is provided, and having a first perpendicular magnetic anisotropy energy that is mainly produced from interface interaction between the free layer and the tunnel barrier layer and decreases to zero by the application of a critical bias voltage on the tunnel barrier layer, and a variable magnetization direction, a first critical current for spin transfer torque switching; an adjacent-bias layer having a second perpendicular magnetic anisotropy energy and a variable magnetization direction, a second critical current for spin transfer torque switching, wherein the first critical current for spin transfer torque switching of the free layer is at least 3 times higher than the second critical current for spin transfer torque switching of the adjacent-bias layer, the free layer and the adjacent-bias layer have a perpendicular distance between 0.7 nm and 15 nm, the free layer produces a first magnetic dipole field on the adjacent-bias layer, the adjacent-bias layer produces a second magnetic dipole field on the free layer, the method employed to write the free layer to a target state and comprising:

(a) performing an application of a first writing pulse of a first voltage and a first duration to the perpendicular magnetoresistive element so that the amount of spin polarization electrons flowing into the free layer is insufficient to initiate a process of switching the magnetization direction of the free layer, and the amount of spin polarized electrons flowing into the adjacent-bias layer is sufficient to switch the magnetization direction of the adjacent-bias layer to be aligned anti-parallel to the free layer magnetization direction;

(b) performing an application of a second writing pulse of a second voltage and a second duration to the perpendicular magnetoresistive element so that the amount of spin polarization electrons flowing into the adjacent-bias layer is insufficient to initiate a process of switching the magnetization direction of the adjacent-bias layer, and the first perpendicular magnetic anisotropy is sufficiently reduced to lead a switch of the free layer magnetization direction to be aligned parallel to the adjacent-bias layer magnetization direction under the second magnetic dipole field;

wherein the second write pulse is applied immediately after the first write pulse, the second voltage is at least two thirds of the critical bias voltage.

19. The element of claim 18, further comprising: performing a pre-read process before performing applications of the first write pulse and the second write pulse to measure the state of the free layer, and aborting performing applications of the first write pulse and the second write pulse once the state of the free layer is the same as the target state.

20. A write method of a magnetic memory device having a circuitry and a magnetoresistive element comprising: a tunnel barrier layer provided on a surface of the reference layer; a recording structure comprising a free layer provided on a surface of the tunnel barrier layer which is opposite to a surface of the tunnel barrier layer where the reference layer is provided, and having a first perpendicular magnetic anisotropy energy that is mainly produced from interface interaction between the free layer and the tunnel barrier layer and decreases to zero by the application of a critical bias voltage on the tunnel barrier layer, and a variable magnetization direction, a first critical current for spin transfer torque switching; an adjacent-bias layer having a second perpendicular magnetic anisotropy energy and a variable magnetization direction, a second critical current for spin transfer torque switching, wherein the first critical current for spin transfer torque switching of the free layer is at least 3 times higher than the second critical current for spin transfer torque switching of the adjacent-bias layer, the free layer and the adjacent-bias layer have a perpendicular distance between 0.7 nm and 15 nm, the free layer produces a first magnetic dipole field on the adjacent-bias layer, the adjacent-bias layer produces a second magnetic dipole field on the free layer, the method employed to write the free layer to a target state and comprising:

(a) performing an application of a first writing pulse having a first voltage and a first duration to the perpendicular magnetoresistive element so that the amount of spin polarization electrons flowing into the free layer is insufficient to initiate a process of switching the magnetization direction of the free layer, and the amount of spin polarized electrons flowing into the adjacent-bias layer is sufficient to switch the magnetization direction of the adjacent-bias layer to be aligned anti-parallel to the free layer magnetization direction;
  (b) performing a reading process during the first write pulse to determine whether the state of the free layer is the same as the target state, and
  (b1) if the state of the free layer is the same as the target state, performing an application of a second writing pulse having a second voltage and a second duration to the perpendicular magnetoresistive element so that the amount of spin polarization electrons flowing into the adjacent-bias layer is insufficient to initiate a process of switching the magnetization direction of the adjacent-bias layer, and the first perpendicular magnetic anisotropy is sufficiently reduced to lead a switch of the free layer magnetization direction to be aligned parallel to the adjacent-bias layer magnetization direction under the second magnetic dipole field;
  (b2) if the state of the free layer is not the same as the target state, performing an application of a back-writing pulse having a first voltage of an opposite sign and the first duration to the perpendicular magnetoresistive element so that the amount of spin polarization electrons flowing into the free layer is insufficient to initiate a process of switching the magnetization direction of the free layer, and the amount of spin polarized electrons flowing into the adjacent-bias layer is sufficient to switch the magnetization direction of the adjacent-bias layer back to be aligned parallel to the free layer magnetization direction, wherein the second write pulse is applied immediately after the first write pulse, the second voltage is at least two thirds of the critical bias voltage.

* * * * *